United States Patent [19]

Ross

[11] Patent Number: 4,635,093
[45] Date of Patent: Jan. 6, 1987

[54] ELECTRICAL CONNECTION

[75] Inventor: Arthur L. Ross, Bala Cynwyd, Pa.

[73] Assignee: General Electric Company, Philadelphia, Pa.

[21] Appl. No.: 740,955

[22] Filed: Jun. 3, 1985

[51] Int. Cl.⁴ .................... H01L 39/02; H02G 13/08; H01R 9/00
[52] U.S. Cl. ...................................... 357/80; 357/74; 174/52 FP; 174/68.5; 361/400; 361/401; 361/408
[58] Field of Search ............... 357/74, 80; 174/52 FP, 174/52 R, 68.5; 361/380, 386, 389, 397, 398, 339, 361, 399, 400, 401, 402, 408, 404, 405; 339/17 K, 17 CF, 17 F, 17 LC

[56] References Cited

U.S. PATENT DOCUMENTS

| | | | |
|---|---|---|---|
| 3,374,533 | 7/1968 | Burks et al. | 29/577 R |
| 3,483,308 | 3/1969 | Wakely | 174/52 FP |
| 3,887,783 | 7/1975 | Comette | 219/85 R |
| 4,147,889 | 4/1979 | Andrews et al. | 174/52 FP |
| 4,281,941 | 5/1981 | Rottenkolber | 403/29 |
| 4,351,580 | 10/1982 | Kirkman et al. | 339/17 CF |
| 4,489,365 | 12/1984 | Daberkoe | 174/68.5 |

FOREIGN PATENT DOCUMENTS 0146986 11/1979 Japan ..................................... 357/74
0027550  2/1984 Japan ..................................... 357/75

OTHER PUBLICATIONS

P. M. Hall, *Solder Attachment of Leadless Ceramic Chip Carries,* Solid State Technology; Mar. 1983; pp. 103-107.

*Primary Examiner*—James W. Davie
*Assistant Examiner*—Georgia Y. Epps
*Attorney, Agent, or Firm*—Allen E. Amgott

[57] ABSTRACT

An improved electrical connection between a leadless chip carrier and one or more circuits on a printed circuit board is disclosed. A solder fillet connects a metallization layer on the groove face of the carrier to the printed circuit. The solder fillet is fused to only a portion of the full length of the metallization layer, thereby permitting the unfused layer portion to flex when differential expansion and contraction between the carrier and the substrate occurs. Thus, the solder fillet is only minimally stressed and the chance of failure of the connection due to cracking is reduced. The center of the carrier may be mechanically fastened to the substrate in order to equalize the differential expansion between different parts of the carrier and the substrate.

15 Claims, 4 Drawing Figures

ELECTRICAL CONNECTION

The present invention relates in general to electrical connections for semiconductor chip carriers and more particularly to new and improved solder joints for connecting a leadless carrier of semiconductor chips to a printed circuit board.

BACKGROUND OF THE INVENTION

In the manufacture of electronic circuits, a number of silicon chips may be combined into a single package which must then be electrically connected to the circuits on the underlying substrate, such as a printed circuit board. Leadless chip carriers are frequently used for this purpose because of their relatively low cost, sturdiness and ease of handling. Generally, they are connected to the underlying printed circuit board by means of soldered electrical connections between the chip and metallized pads that are positioned on the printed circuit board under or adjacent the carrier body. A disadvantage of this type of device is the susceptiblity to stress-cracking of the solder connection. Such cracking may be caused by the small differential movement between the circuit board and the carrier due to unequal expansion of these components during operational heating and cooling cycles. Typically, the substrate or circuit board may consist of a fiber-reinforced resin composite material, with a coefficient of expansion which is different from that of the ceramic material used for the chip carrier.

Another problem that may occur when a leadless chip carrier is used derives from the portion of the solder material which is deliberately deposited underneath the carrier body in order to enhance the electrical connection. Solder material in that area is stressed to a greater extent than the solder fillet adjacent the carrier and, thus, cracks are more likely to originate in that area upon unequal expansion or contraction of the board and carrier.

OBJECTS OF THE INVENTION

It is a principal object of the present invention to provide a new and improved solder joint connection between a leadless ceramic chip carrier and one or more circuits on a printed circuit board, which connection is not subject to the foregoing problems and disadvantages.

It is another object of the invention to provide a solder joint between a leadless chip carrier and a printed circuit board in which crack propagation is inhibited during differential movement upon unequal expansion or contraction of the carrier and the circuit board.

It is still another object of the present invention to provide a structurally simple and inexpensively fabricated solder joint connection between a leadless chip carrier and a printed circuit board in which crack propagation is inhibited upon unequal expansion or contraction of the connected components.

SUMMARY OF THE INVENTION

The present invention is directed to an improved solder joint in the form of a solder fillet between the metallization layer on each groove face of a grooved, leadless chip carrier and one or more printed circuit conductors on the substrate supporting the carrier. In a preferred embodiment of the invention, the solder fillet extends only partially up each groove face of the chip carrier. This construction permits the metallization layer to flex away from the chip carrier and thus provides an electrical connection between the substrate and the carrier capable of withstanding differential movement therebetween.

These and other objects of the invention, together with the features and advantages thereof, will become apparent from the following detailed specification when read in conjunction with the accompanying drawings in which applicable reference numbers have been carried forward.

BRIEF DESCRIPTION OF THE DRAWINGS

FIG. 4 illustrates the present invention upon differential movement between the chip carrier and the substrate.

DESCRIPTION OF THE INVENTION

Figure 1:
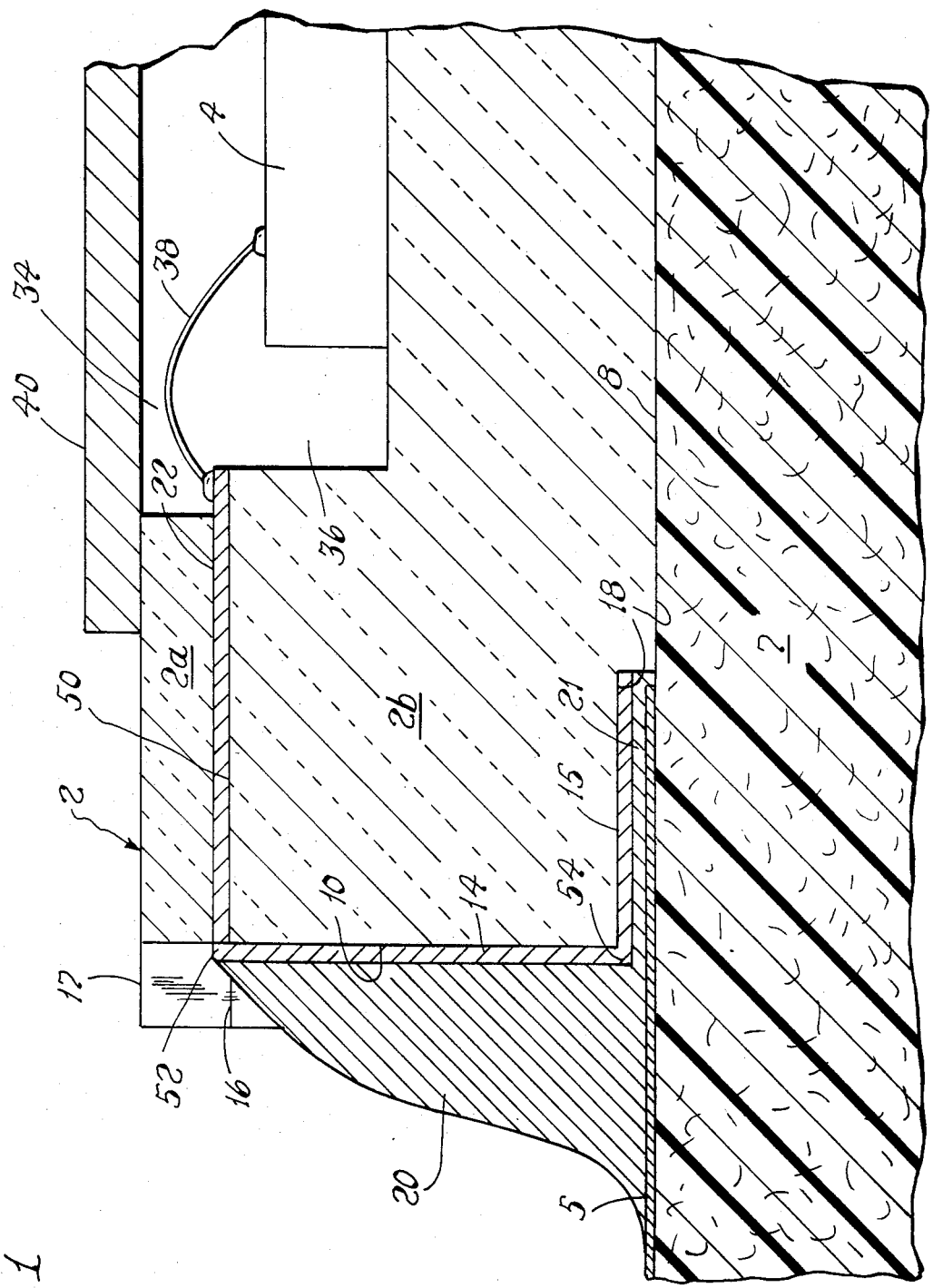
FIG. 1 illustrates in cross section a solder connection of the kind heretofore in use, between a leadless chip carrier and its underlying substrate.

With reference now to the drawings, FIG. 1 illustrates a connection of the type heretofore in use between a chip carrier and a printed circuit board. The general arrangement of the connected components, using the new and improved connection, is further illustrated in FIG. 2. A chip carrier 2 is positioned on a surface 8 of a substrate 7, otherwise referred to herein as a printed circuit board. A printed circuit, illustrated in the form of individual conductors 5 in the drawings, is disposed on surface 8. Conductors 5 are illustrated as being raised above substrate surface 8, but they may also be flush with the surface, or below the surface level. At most, conductors 5 extend about 3.0 mils above surface 8. Carrier 2 comprises first an-d second superposed slabs 2a and 2b, which include first and second parallel carrier surfaces 17 and 18, respectively. For purposes of reference only, slabs 2a and 2b are sometimes referred to herein as upper and lower slabs, respectively, and they define a seam 16 between them.

Figure 2:
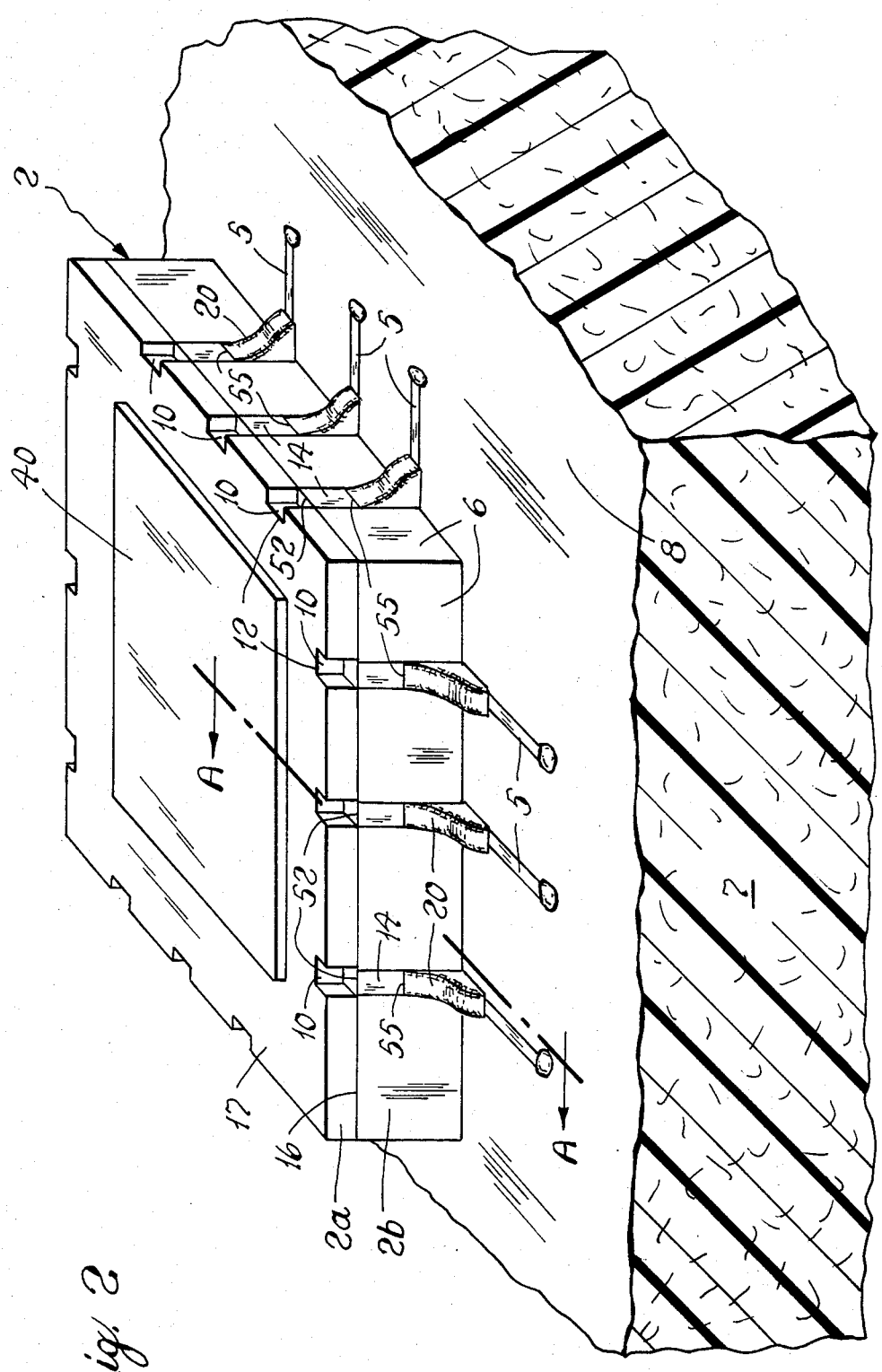
FIG. 2 is a perspective view of a chip carrier and its substrate, which illustrates solder connections in accordance with the present invention.

As best seen from FIG. 2, carrier 2 also includes four mutually perpendicular lateral surfaces 6, which are further perpendicular to carrier surfaces 17 and 18. A lid 40, of metal or of ceramic material, is adhesively attached to carrier surface 17 and covers an aperture 34 in upper slab 2a. Aperture 34 exposes a recess 36 in slab 2b. One or more silicon chips 4 are positioned within recess 36. A pattern of conductive strips 22 is disposed on surface 50, each strip having a maximum thickness on the order of about 0.5 mils–1.5 mils. Each strip 22 is electrically connected to chip 4 by means of a wire lead 38.

Carrier 2 further includes a plurality of mutually spaced grooves 12 disposed in one or more of the lateral carrier surfaces 6. Each groove includes a groove face 10 on which a metallization layer 14 is disposed. Layer 14, which may be deposited on the groove face by conventional electroplating techniques, may consist of a metal such as palladium, nickel, copper, or molybdenum and has a thickness on the order of about 0.5 mils–1.5 mils. A first end 52 of layer 14 is bonded to one of the aforesaid conductive strips 22 by conventional bonding techniques.

In the prior art connection illustrated in FIG. 1, metallization layer 14 extends along the full length of groove face 10 down to carrier surface 18 and then continues along a portion of the latter surface underneath the carrier so as to form layer portion 15 on surface 18. Layer portion 15 similarly has a thickness on the order of about 1.0 mil. It will be clear that layers 14, 15, conductors 5 and strips 22 each have a thickness which is small relative to the thickness of either the substrate or the carrier. In the drawings, each of these conductors is shown exaggerated in thickness for the sake of illustration. Thus, in practice, carrier surface 18 lies substantially in contact throughout with substrate surface 8.

In the prior art device shown in FIG. 1, a solder fillet 20 establishes the electrical connection between each layer 14 and the corresponding printed circuit conductor 5. Fillet 20, typically consisting of an alloy of lead and tin having a low melting point, such as solder, is fused to metallization layer 14 along the full length thereof. When heating of the connection occurs, for example, due to current flow through the connection, substrate 7 which normally has greater coefficient of expansion than ceramic carrier 2, will expand to a greater extent in the plane of surface 8 than the overlying carrier. The resultant differential movement in the plane of surfaces 8 and 18 may then cause the relatively rigid solder fillet 20 to crack. Further crack propagation may occur when the substrate contracts during subsequent cooling. In time, the above-described differential movement may result in thermal fatigue failure of the electrical connection between the chip carrier and the substrate.

In the prior art connection shown in FIG. 1, a solder pad 21 extends from fillet 20 along conductor 5 on substrate surface 8 and underlies the layer portion 15 in order to enhance the electrical connection. The shear rigidity of the thin solder pad 21 between conductor 5 and layer portion 15 results in significantly large shear stresses during thermal cycling, which are intensified at the corner junction with the solder fillet 20 which rigidly connects conductor 5 and layer 14. These cyclic thermal stresses often cause thermally induced fatigue failure of the solder connections as a result of successive heating and cooling during operation of the circuit.

Figure 3:
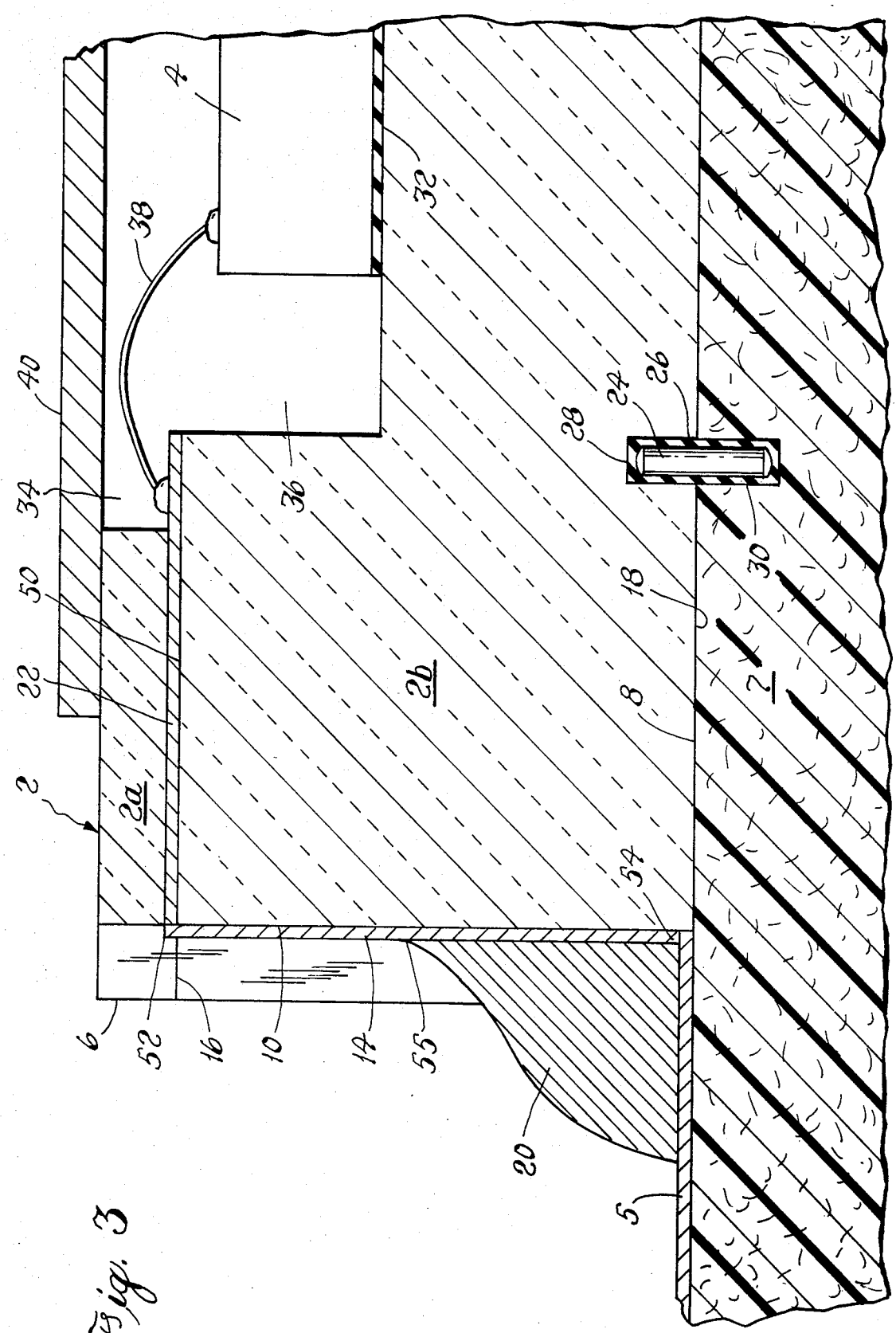
FIG. 3 is a cross-sectional view of the present invention taken along line A—A of FIG. 2.
Figure 2:
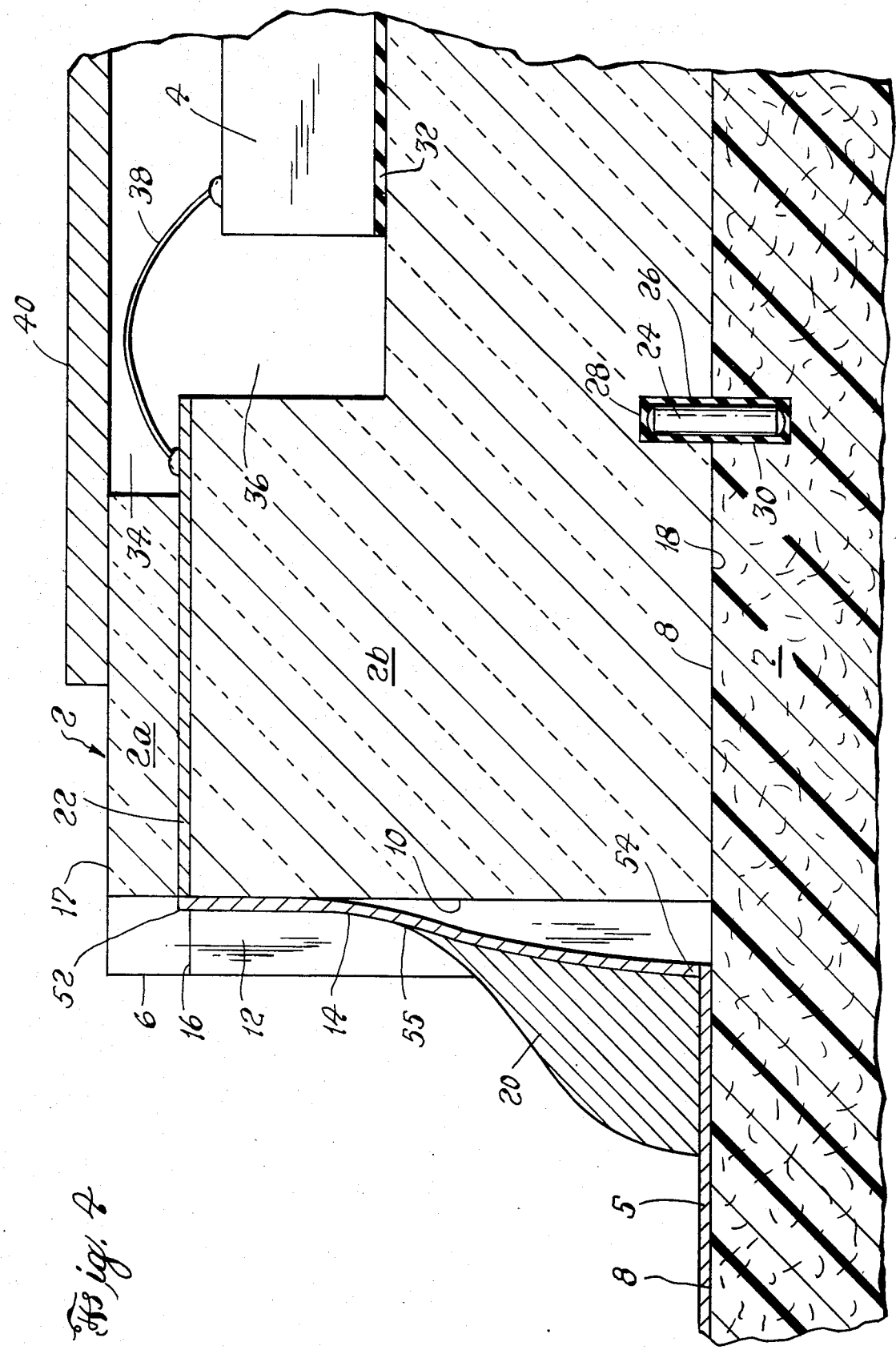

FIGS. 2 and 3 illustrate solder connections in accordance with the present invention between a chip carrier and a printed circuit board. Although chip carrier 2 is not limited as to its shape, the preferred configuration of the carrier is that of a parallelepiped. As best seen from FIG. 2, it consists of the aforementioned pair of slabs 2a and 2b. As in the case of the apparatus shown in FIG. 1, a metallized layer 14 adheres to each groove face 10. However, layer 14 extends only between the aforesaid first end 52 and a second layer end 54. The latter end is located substantially at carrier surface 18 and thus near printed circuit conductor 5 on substrate surface 8. As shown, conductor 5 terminates at slab 2b.

Solder fillet 20, which is relatively rigid, extends outward from surface 6 along conductor 5 and is fused to the latter. Fillet 20 also extends along layer 14, from end 54 to a terminating line 55 which is located between ends 52 and 54. Thus, unlike the structure shown in FIG. 1, in accordance with the present invention, solder fillet 20 terminates short of first layer end 52.

The manner in which the solder is applied in the present invention may follow any of several well-known techniques. To prevent solder from adhering to unwanted areas, a dewetting substance, e.g. a photoresist, may be used. The presence of the dewetting substance between terminating line 55 and end 52 of layer 14 will prevent the solder from adhering to the layer portion so covered. Accordingly, the solder will fuse only to the portion of layer 14 which is below line 55 in FIGS. 2 and 3. Thus, the electrical connection so established between layer 14 and printed circuit conductor 5 leaves an unfused layer portion above line 55, i.e. a layer portion which is not in contact with the solder fillet.

FIG. 4 illustrates the action of the present invention upon the occurrence of differential movement between carrier surface 18 and substrate surface 8 due to the above-described thermal cycling. For the purpose of illustration only, the differential displacement is shown exaggerated in the drawing. As illustrated, when the relative movement of substrate surface 8 causes solder fillet 20 to move to the left in FIG. 4, the unfused portion of metallization layer 14, between terminating line 55 and layer end 52, is capable of flexing outward, i.e. away from the chip carrier. The flexing action allows the fused portion of layer 14 to move with substrate surface 8 away from carrier 2 without imposing undue stress on solder fillet 20 and, hence, without promoting cracking of the fillet. In practice, the distance moved is very small, being no greater than about 10 microinches per inch of substrate length per degree centigrade. However, this degree of freedom allows solder fillet 20 to remain in electrical contact with layer 14 and with printed circuit conductor 5 on substrate surface 8, without imposing undue stress on the relatively rigid solder material. The foregoing action is further aided by the absence of a solder pad beneath carrier 2. As explained in connection with FIG. 1, the presence of such a solder pad imposes additional shear stress on the solder fillet during the aforesaid differential movement.

When substrate surface 8 subsequently contracts, the flexibility of the unfused layer portion allows solder fillet 20 to return to its original position at groove face 10 by moving to the right in FIG. 4, again without placing undue stress on the fillet. Thus, because the stress placed on solder fillet 20 during successive thermal cycles remains small due to the flexing action of layer 14, the electrical connection between chip 4 and the printed circuits on substrate surface 8 remains intact.

According to a further feature of the present invention, the center of carrier 2 may be mechanically fastened to substrate 7 in order to equalize the differential expansion between extreme portions of the carrier and substrate 7. Although the invention is not so limited, such fastening may be advantageously carried out by means of a pin 24, as shown in FIGS. 3 and 4. A bore 28 in carrier surface 18, located centrally of carrier 2, is in registry with a similar bore 30 in substrate surface 18. The depth of each bore is approximately one-half the length of pin 24, the latter being adhesively fastened in each bore by means of a suitable adhesive compound. Once the adhesive has cured, a secure mechanical attachment results between substrate 7 and carrier 2. Pin 24 further acts as an anchor for chip carrier 2. This prevents vibrations from mechanically dislodging the carrier from the substrate and thereby endangering the electrical connection between the carrier and the printed circuit on substrate surface 8. Those skilled in the art will recognize that, in lieu of the pin arrangement described above, carrier 2 may also be bonded directly to substrate surface 8 by means of an adhesive applied between the center of the carrier and the substrate surface.

Although the chip carrier has been illustrated and described as a parallelepiped with four lateral surfaces 6, it will be clear that the invention is not so limited. Thus, the chip carrier may be configured with a larger number of lateral surfaces than shown, or it may be disk-shaped with only a single surface. In either case, grooves 12 are mutually spaced along the lateral surface(s), and they are perpendicular to surfaces 17 and 18. An advantageous aspect of a disk-shaped chip carrier is that the expansion and contraction of the carrier due to thermal cycles is equalized if the carrier is fastened at its center to the underlying substrate. As a consequence, substantially equal flexing of the metallization layers occurs around the curved lateral surface of the carrier, and each solder connection is stressed by the same minimal amount. Also, flexing of each conductor 14 is then in its principal bending direction, i.e. there is a minimum of sidewards bending and shear.

While the invention has been described with respect to a preferred embodiment, it will be apparent that many modifications, variations, changes and substitutions will now occur to those skilled in the art without departing from the spirit and scope of the invention herein. Accordingly, it is intended that the invention be limited only by the scope of the claims appended hereto.

What is claimed is:

1. An electrical connection between a surface of a printed circuit-carrying substrate and a leadless carrier for semiconductor chips positioned on said substrate surface, said chip carrier including first and second mutually spaced, substantially parallel carrier surfaces and at least one lateral surface therebetween, said second carrier surface being in contact with said substrate;
   a plurality of grooves in said lateral surface extending between said parallel surfaces, each of said grooves including a groove face substantially parallel to said lateral surface;
   a metallization layer on each of said groove faces bounded by first and second mutually spaced layer ends, said second layer end being located substantially at said second carrier surface; and
   a relatively rigid solder fillet associated with each of said grooves, each of said fillets being fused to said circuit on said substrate surface and to a portion of said layer on the corresponding groove face, said fused layer portion extending from said second layer end to a terminating line positioned short of said first layer end;
   whereby the unfused portion of said layer between said terminating line and said first layer end is capable of flexing to permit said fused layer portion to move relative to said lateral surface substantially without damage to said solder fillet whenever a differential movement occurs between said carrier and said substrate surface due to unequal expansion or contraction of said carrier and said substrate.

2. The electrical connection of claim 1 wherein said second layer end is spaced from said second carrier surface a distance sufficient to prevent solder applied to said layer from flowing between said second carrier surface and said substrate surface.

3. The electrical connection of claim 1 wherein said unfused layer portion is coated with a dewetting substance adapted to inhibit adhesion of solder thereto.

4. The electrical connection of claim 1 and further including means for fastening said carrier to said substrate surface centrally of said carrier, said fastening means being adapted to equalize said differential movement upon unequal expansion or contraction of said carrier and said substrate.

5. The electrical connection of claim 4 and further including a bore located substantially centrally in said second carrier surface;
   a bore in said substrate surface in registry with said bore in said second carrier surface; and
   said fastening means comprising a pin embedded in said registering bores adapted to hold said carrier in position in contact with said substrate surface.

6. The electrical connection of claim 4 wherein said fastening means comprises an adhesive placed at least between a substantially central area of said second carrier surface and said substrate surface.

7. The electrical connection of claim 1 wherein said first and second carrier surfaces are substantially planar and normal to said lateral surface therebetween;
   said grooves being perpendicular to said first and second carrier surfaces and being mutually spaced along said lateral surface.

8. The electrical connection of claim 7 wherein said carrier has four mutually perpendicular lateral surfaces normal to said first and second carrier surfaces;
   at least some of said lateral surfaces containing a plurality of said mutually spaced grooves each including a metallization layer on the groove face thereof; and
   a solder fillet connecting each of said layers to said printed circuit.

9. The electrical connection of claim 8 wherein said carrier comprises at least first and second superposed slabs including mutually contacting surfaces between said first and second carrier surfaces respectively;
   said mutually contacting surfaces defining a seam around the periphery of said carrier parallel to said first and second carrier surfaces; and
   said first layer ends coinciding with said seam such that the metallization layer on each of said groove faces is limited to said second slab.

10. The electrical connection of claim 9 wherein the surface of said second slab in contact with said first slab carries a plurality of conductive strips; and
    each of said first layer ends being bonded to one of said conductive strips to establish a continuous connection between the latter and the circuit on said substrate surface.

11. The electrical connection of claim 10 wherein said second slab includes a substantially central recess in said strip-carrying slab surface, said first slab including an aperture exposing said recess and a surrounding portion of said strip-carrying slab surface; and
    a semiconductor chip fastened to said second slab within said recess and electrically connected to said conductive strips on said surrounding slab surface portion.

12. The electrical connection of claim 11 and further including a lid bonded to said first carrier surface and covering said aperture.

13. An electrical connection between a surface of a printed circuit-carrying substrate and a leadless carrier for semiconductor chips positioned on said substrate surface, said carrier including first and second superposed slabs including first and second substantially parallel planar carrier surfaces respectively, said second carrier surface being in contact with said substrate surface, said carrier further including four mutually perpendicular, lateral carrier surfaces extending between said first and second carrier surfaces and normal to the latter, said slabs including mutually contacting surfaces between said first and second carrier surfaces defining a seam around the periphery of said carrier parallel to said first and second carrier surfaces;

- a plurality of mutually spaced grooves in each of said lateral surfaces each traversing said seam between said first and second carrier surfaces and perpendicular to the latter, each of said grooves including a groove face substantially parallel to the corresponding lateral surface;
- a metallization layer on each of said groove faces extending from said seam substantially to said second carrier surface;
- a relatively rigid solder fillet associated with each of said grooves, each of said fillets being fused to said circuit on said substrate surface and to a portion of said layer on the corresponding groove face, said fused layer portion extending substantially from said second carrier surface to a terminating line short of said seam; and
- means for fastening said carrier to said substrate surface substantially centrally of said carrier, said fastening means being adapted to equalize differential movement between said carrier and said substrate upon unequal expansion or contraction thereof;

whereby the unfused portion of each of said metallization layers between said terminating line and said seam is capable of flexing to permit said fused layer portion to move relative to the adjacent lateral surface substantially without damage to said solder fillet whenever said differential movement between said carrier and said substrate occurs.

14. The electrical connection of claim 13 and further including a bore located substantially centrally of said second carrier surface;

- a bore in said substrate surface in registry with said bore in said second carrier surface; and
- said fastening means comprising a pin embedded in said registering bores adapted to hold said carrier in position in contact with said substrate surface.

15. The electrical connection of claim 13 and further including a plurality of conductive strips on the surface of said second slab in contact with said first slab;

- a substantially central recess in said strip-carrying slab surface;
- said first slab including an aperture exposing said recess and a surrounding portion of said strip-carrying slab surface;
- a semiconductor chip fastened to said second slab within said recess and electrically connected to said conductive strips on said surrounding slab surface portion; and
- a lid bonded to said first carrier surface covering said aperture.

* * * * *